(12) United States Patent
Lee et al.

(10) Patent No.: US 7,102,208 B1
(45) Date of Patent: Sep. 5, 2006

(54) LEADFRAME AND SEMICONDUCTOR PACKAGE WITH IMPROVED SOLDER JOINT STRENGTH

(75) Inventors: Tae Heon Lee, Kuri-shi (KR); Young Suk Chung, Seoul (KR); Mu Hwan Seo, Aspen Heights (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,048

(22) Filed: Oct. 13, 2000
(Under 37 CFR 1.47)

(30) Foreign Application Priority Data

Oct. 15, 1999 (KR) .............................. 1999-44650

(51) Int. Cl.
*H01L 23/495* (2006.01)

(52) U.S. Cl. ...................... 257/666; 257/690; 257/787

(58) Field of Classification Search ........ 257/666–670, 257/672, 674, 676, 690–693, 784, 684, 695, 257/787–788, 678, 730, 734–735
See application file for complete search history.

(56) References Cited

U.S. PATENT DOCUMENTS

| | | | |
|---|---|---|---|
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,417,266 A | 11/1983 | Grabbe | |
| 4,530,152 A | 7/1985 | Roche et al. | ................. 29/588 |
| 4,707,724 A | 11/1987 | Suzuki et al. | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |

(Continued)

FOREIGN PATENT DOCUMENTS

DE 19734794 A1 8/1997

(Continued)

OTHER PUBLICATIONS

JEDEC Solid State Product Outline, "2 Lead Header Family Surface Mounted (Peripheral Terminals)", 4 pages.

(Continued)

*Primary Examiner*—Hoai Pham
*Assistant Examiner*—Dilinh Nguyen
(74) *Attorney, Agent, or Firm*—Stetina Brunda Garred & Brucker (57) ABSTRACT

A semiconductor leadframe and a semiconductor package using same. More particularly, a semiconductor leadframe offering improved solder joint strength between a semiconductor package and a motherboard is disclosed. The leadframe comprises a plate-type frame body; a chip paddle on which a semiconductor chip may be mounted; a plurality of internal leads located radially and spaced at regular intervals about the perimeter of the chip paddle; external leads extending outward from the internal leads and with their terminals connecting to the frame body; and dam bars at the juncture of each external and internal lead for additional support and to ensure that the external leads remain exposed during subsequent encapsulation processes. The leadframe of the present invention providing additional solder joint strength through the use of internal leads having different lengths or surface areas.

19 Claims, 7 Drawing Sheets

U.S. PATENT DOCUMENTS

| | | |
|---|---|---|
| 4,987,475 A | 1/1991 | Schlesinger et al. |
| 5,029,386 A | 7/1991 | Chao et al. |
| 5,041,902 A | 8/1991 | McShane ............... 357/79 |
| 5,065,223 A | 11/1991 | Matsuki et al. |
| 5,070,039 A | 12/1991 | Johnson et al. |
| 5,087,961 A | 2/1992 | Long et al. |
| 5,096,852 A | 3/1992 | Hobson |
| 5,157,480 A | 10/1992 | McShane et al. ............ 357/74 |
| 5,172,213 A | 12/1992 | Zimmerman ............... 257/796 |
| 5,172,214 A | 12/1992 | Casto ................... 257/676 |
| 5,200,362 A * | 4/1993 | Lin et al. .................. 29/841 |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. ............ 257/707 |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha ...................... 257/676 |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. ................ 257/676 |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs .................. 257/706 |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son ..................... 253/693 |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii ................... 257/684 |
| 5,844,306 A | 12/1998 | Fujita et al. |
| 5,859,471 A | 1/1999 | Kuraishi et al. |
| 5,866,939 A * | 2/1999 | Shin et al. |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. .... 174/52.4 |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A * | 8/1999 | Okumura et al. |
| 5,951,305 A | 9/1999 | Haba |
| 5,959,356 A | 9/1999 | Oh |
| 5,973,388 A | 10/1999 | Chew et al. |
| 5,976,912 A | 11/1999 | Fukutomi et al. |
| 5,977,613 A | 11/1999 | Takata et al. .............. 257/666 |
| 5,977,615 A | 11/1999 | Yamaguchi et al. |
| 5,977,630 A | 11/1999 | Woodworth et al. ........ 257/712 |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,028,350 A * | 2/2000 | Sabyeying |
| 6,031,279 A | 2/2000 | Lenz |
| RE36,613 E | 3/2000 | Ball |
| 6,034,423 A * | 3/2000 | Mostafazadeh et al. ..... 257/691 |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,087,722 A | 7/2000 | Lee et al. |
| 6,100,594 A | 8/2000 | Fukui et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn .................. 174/52.4 |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,197,615 B1 | 3/2001 | Song et al. |
| 6,198,171 B1 | 3/2001 | Huang et al. |

| | | | | | |
|---|---|---|---|---|---|
| 6,201,186 B1 | 3/2001 | Daniels et al. | JP | 58-101317 | 6/1983 |
| 6,201,292 B1 | 3/2001 | Yagi et al. | JP | 58-160095 | 9/1983 |
| 6,204,554 B1 | 3/2001 | Ewer et al. | JP | 59208756 | 11/1984 |
| 6,208,020 B1 | 3/2001 | Minamio et al. | JP | 59227143 | 12/1984 |
| 6,208,023 B1 | 3/2001 | Nakayama et al. | JP | 60010756 | 1/1985 |
| 6,211,462 B1 | 4/2001 | Carter, Jr. et al. | JP | 60116239 | 8/1985 |
| 6,218,731 B1 | 4/2001 | Huang et al. | JP | 60195957 | 10/1985 |
| 6,222,258 B1 | 4/2001 | Asano et al. | JP | 60231349 | 11/1985 |
| 6,225,146 B1 | 5/2001 | Yamaguchi et al. | JP | 61-39555 | 2/1986 |
| 6,229,200 B1 | 5/2001 | Mclellan et al. ............ 257/666 | JP | 62-9639 | 7/1987 |
| 6,229,205 B1 | 5/2001 | Jeong et al. | JP | 63-205935 | 8/1988 |
| 6,239,384 B1 | 5/2001 | Smith et al. | JP | 63-233555 | 9/1988 |
| 6,256,200 B1 | 7/2001 | Lam et al. | JP | 63249345 | 10/1988 |
| 6,271,580 B1 * | 8/2001 | Corisis ....................... 257/666 | JP | 63316470 | 12/1988 |
| 6,281,566 B1 | 8/2001 | Magni | JP | 64-54749 | 3/1989 |
| 6,281,568 B1 | 8/2001 | Glenn et al. | JP | 1106456 | 4/1989 |
| 6,282,095 B1 | 8/2001 | Houghton et al. | JP | 4098864 | 3/1992 |
| 6,285,075 B1 | 9/2001 | Combs et al. | JP | 5129473 | 5/1993 |
| 6,291,271 B1 | 9/2001 | Lee et al. | JP | 5166992 | 7/1993 |
| 6,291,273 B1 | 9/2001 | Miyaki et al. | JP | 5283460 | 10/1993 |
| 6,294,830 B1 | 9/2001 | Fjelstad | JP | 6061401 | 3/1994 |
| 6,297,548 B1 | 10/2001 | Moden et al. | JP | 692076 | 4/1994 |
| 6,303,984 B1 | 10/2001 | Corisis | JP | 6-163786 * | 6/1994 |
| 6,309,909 B1 | 10/2001 | Ohgiyama | JP | 6260532 | 9/1994 |
| 6,316,838 B1 | 11/2001 | Ozawa et al. | JP | 07-312405 | 11/1995 |
| 6,323,550 B1 | 11/2001 | Martin et al. | JP | 7297344 | 11/1995 |
| 6,326,244 B1 | 12/2001 | Brooks et al. | JP | 864634 | 3/1996 |
| 6,339,255 B1 | 1/2002 | Shin | JP | 08-125066 | 5/1996 |
| 6,355,502 B1 | 3/2002 | Kang et al. ................. 438/110 | JP | 08-306853 | 11/1996 |
| 6,373,127 B1 | 4/2002 | Baudouin et al. | JP | 09-8205 | 1/1997 |
| 6,380,048 B1 | 4/2002 | Boon et al. | JP | 09-8206 | 1/1997 |
| 6,384,472 B1 | 5/2002 | Huang | JP | 09-8207 | 1/1997 |
| 6,395,578 B1 | 5/2002 | Shin et al. | JP | 09-92775 | 4/1997 |
| 6,400,004 B1 | 6/2002 | Fan et al. | JP | 9092775 | 4/1997 |
| 6,444,499 B1 | 9/2002 | Swiss et al. | JP | 9260568 | 10/1997 |
| 6,452,279 B1 | 9/2002 | Shimoda | JP | 9293822 | 11/1997 |
| 6,464,121 B1 | 10/2002 | Reijnders | JP | 10199934 | 7/1998 |
| 6,498,392 B1 | 12/2002 | Azuma | JP | 10256240 | 9/1998 |
| 6,642,609 B1 * | 11/2003 | Minamio et al. ............ 257/666 | KR | 92-10286 A | 6/1992 |
| 2001/0008305 A1 | 7/2001 | McLellan et al. | KR | 941979 | 1/1994 |
| 2002/0011654 A1 | 1/2002 | Kimura | KR | 96-9774 A | 3/1996 |
| 2002/0024122 A1 | 2/2002 | Jung et al. | KR | 96-9774 B | 7/1996 |
| 2002/0140061 A1 | 10/2002 | Lee | KR | 92-10286 B | 11/1996 |
| 2002/0140068 A1 | 10/2002 | Lee et al. | KR | 199772358 | 11/1997 |

FOREIGN PATENT DOCUMENTS

| | | |
|---|---|---|
| EP | 54021117 | 6/1979 |
| EP | 59050939 | 3/1984 |
| EP | 0 393 997 A2 | 10/1990 |
| EP | 0393997 | 10/1990 |
| EP | 0459493 | 4/1991 |
| EP | 0 459 493 A2 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 1032037 | 8/2000 |
| JP | 55163868 | 12/1980 |
| JP | 57-45959 | 3/1982 |
| KR | 100220154 | 6/1999 |
| WO | 9956316 | 11/1999 |
| WO | 9967821 | 12/1999 |

OTHER PUBLICATIONS

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummala & E. Rymaszewski, published by Van Nostrand Reinhold, NewYork, NY.

National Semiconductor Application Note 1187, "Leadless Leadframe Package (LLP)", Oct. 2002, http://www.national.com/an/AN/AN-1187.pdf.

* cited by examiner

LEADFRAME AND SEMICONDUCTOR PACKAGE WITH IMPROVED SOLDER JOINT STRENGTH

BACKGROUND OF THE INVENTION

1. Field of the Invention

The present invention relates to semiconductor packages and to the leadframes encapsulated therein, and, more particularly, but not by way of limitation, to a leadframe for semiconductor packages which exhibits improved solder joint strength upon being mounted to a motherboard.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, as consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm.

Figure 1:
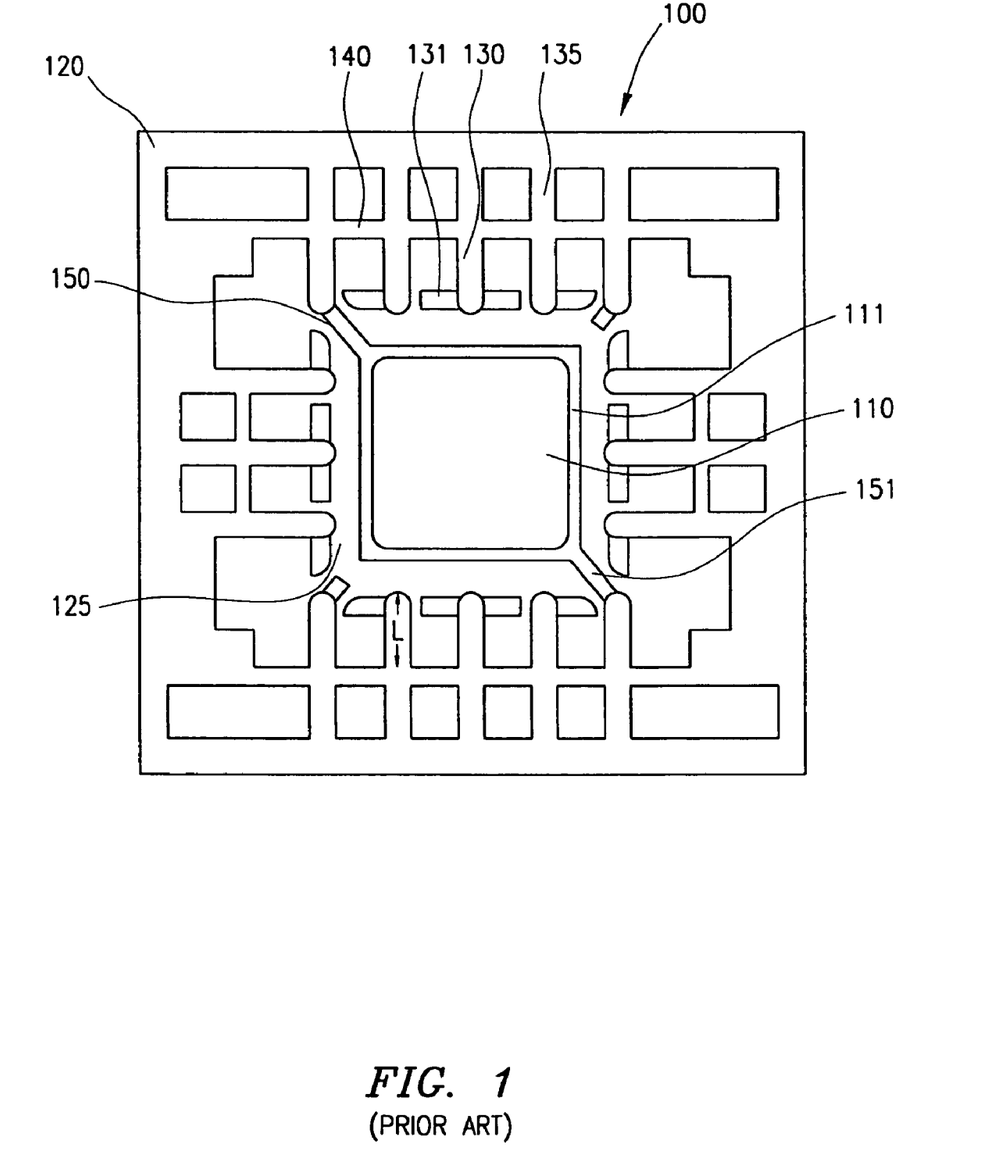
FIG. 1 is a top plan view of a prior art leadframe structure having internal leads of substantially the same length and equal spacing.
Figure 2:
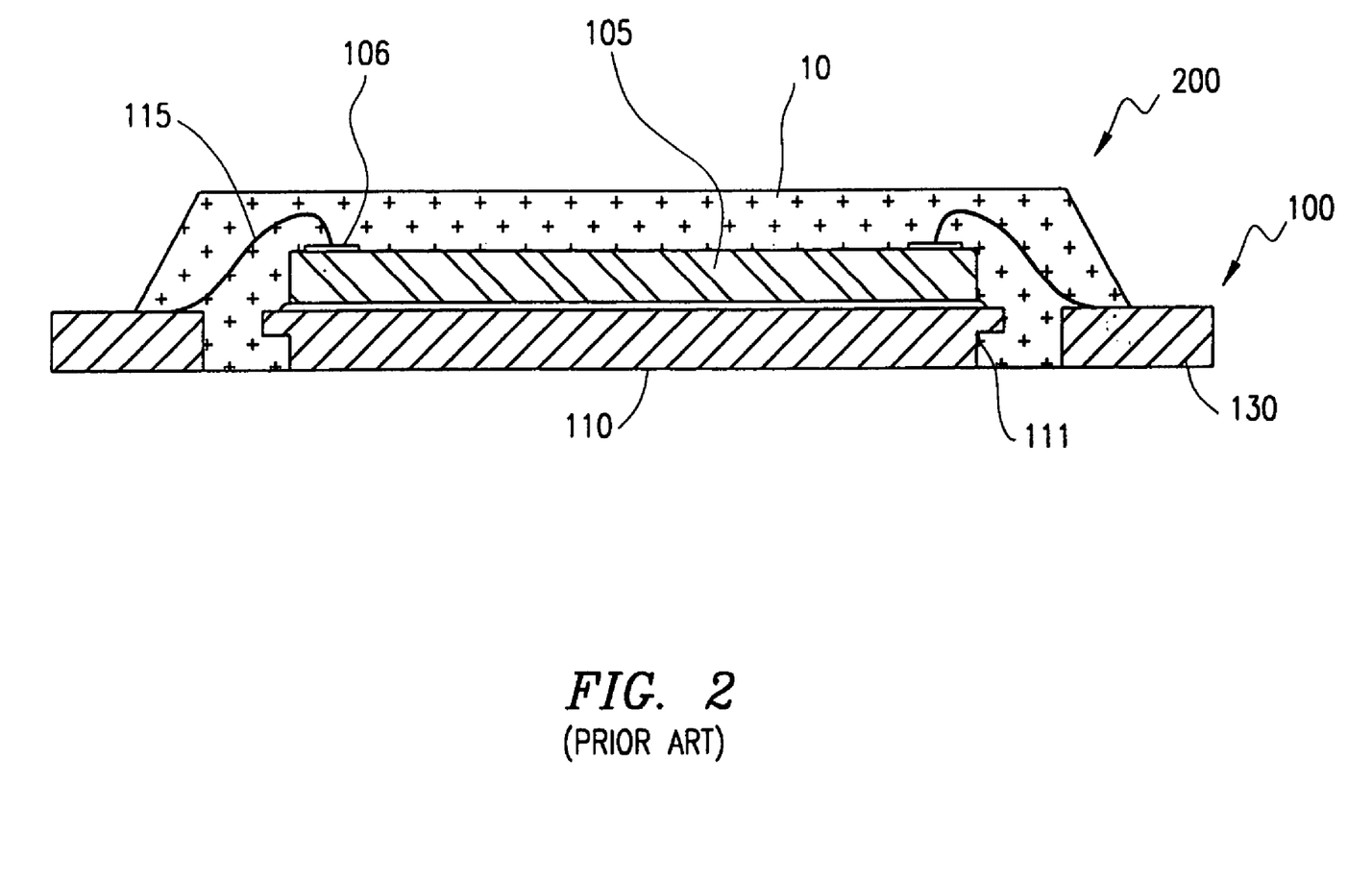
FIG. 2 is a side view of a prior art semiconductor package having a semiconductor chip attached to the leadframe of FIG. 1.
Figure 3:
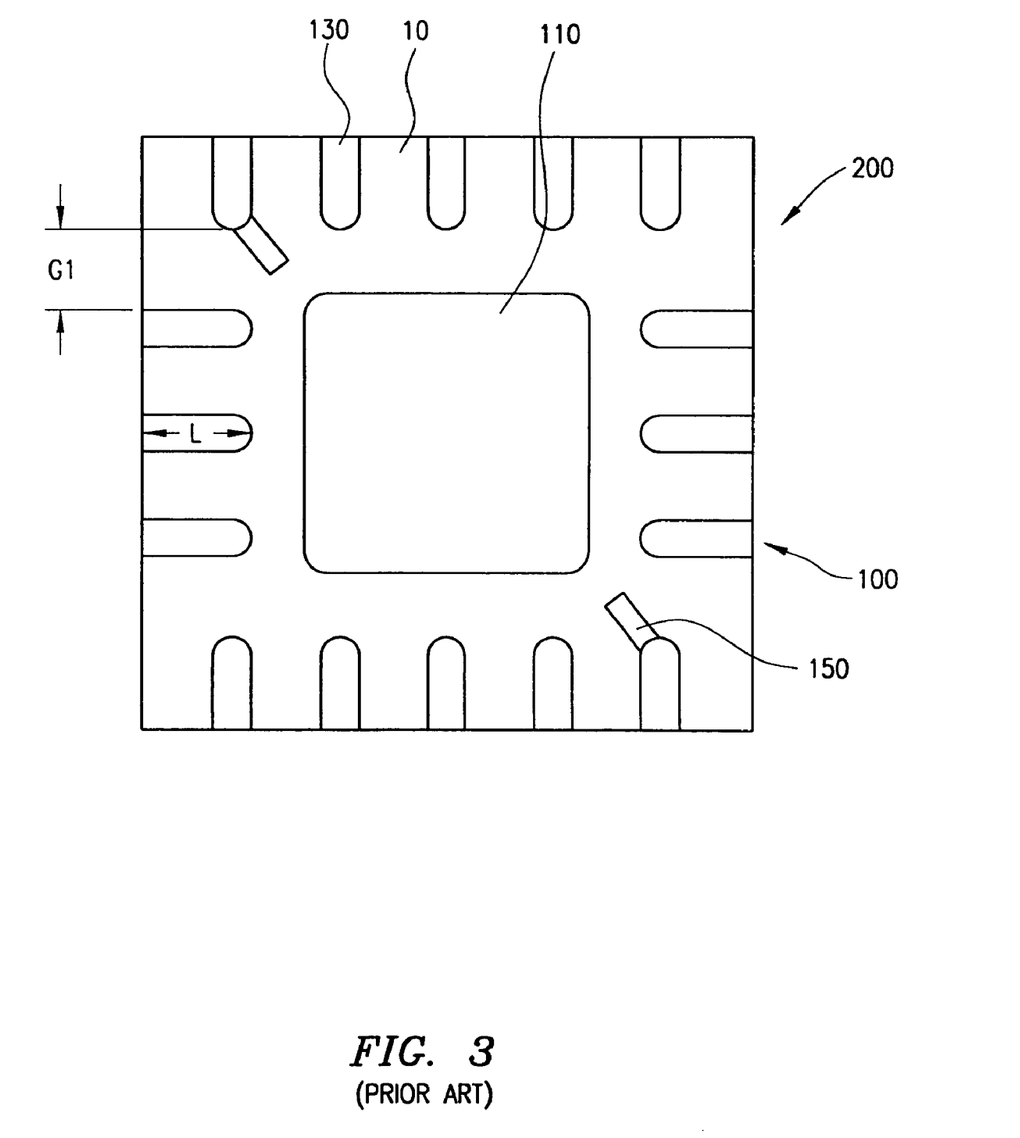
FIG. 3 is a bottom view of a prior art semiconductor package having exposed exterior surfaces or lands on the underside of the chip paddle and internal leads for solder mounting to a motherboard.

In further description of the above-described semiconductor package design aspects, reference is now made to FIGS. 1–3 where a prior art leadframe 100 and semiconductor package 200 are shown. Referring specifically now to FIG. 1, a typical prior art leadframe 100 is shown and described.

The leadframe 100 has a plate-type frame body 120 with an opening 125 at its center and a chip paddle 110 located within the opening 125 on which a semiconductor chip (not shown) is subsequently mounted. About the perimeter of the chip paddle 110 and extending inwardly from the frame body 120 toward the opening 125, a plurality of internal leads 130 are located radially and spaced at regular intervals. The chip paddle 110 is connected to the frame body 120 by tie bars 150 which may be extended inwardly from the ends of at least two internal leads 130, as shown here, or from the frame body 120 itself. The internal leads 130 extend outward into external leads 135 which are in turn made integral to the frame body 120. Dam bars 140 are provided to separate the internal leads 130 from the external leads 135 during the encapsulation process and to prevent encapsulation material (not shown) from covering the external leads 135. It is particularly notable that in the prior art leadframe 100, each of the internal leads 130 are all substantially the same length L.

Referring still to FIG. 1, the reference numerals 111, 131 and 151 denote half-etched portions of chip paddle 110, the internal leads 130 and the tie bars 150, respectively. These half-etched portions will generally be about half as thick as the remainder of the part. During the subsequent encapsulation process for forming a semiconductor package, encapsulation material flows under these portions of the part to ensure a better seal for the internal components.

Referring now to FIG. 2, a semiconductor package 200 using the prior art leadframe 100 is presented. As shown, the semiconductor package 200 includes a semiconductor chip 105 having a plurality of bond pads or input/output pads 106 on its upper surface along its perimeter, and a chip paddle 110 which is bonded to the bottom surface of the semiconductor chip 105 via an adhesive. The chip paddle 110 also features a half-etched portion 111 along its perimeter. A plurality of internal leads 130, each of which has a half-etched portion (not shown) are radially located about the perimeter of the chip paddle 110. The input/output pads 106 of the semiconductor chip 105 are electrically connected to the internal leads 130 via conductive wires 115. As shown here, the semiconductor chip 105, the chip paddle 110, the internal leads 130, and the conductive wires 115, are all sealed within an encapsulation material 10 to create a semiconductor package 200. Referring back to FIG. 1, the external portions of the leadframe 100, namely the dam bars 140 and the external leads 135, which are not encapsulated are then trimmed off. The tie bars 150 may also be cut or singulated following encapsulation to completely separate the chip paddle 110 from the frame body 120.

Referring now to FIG. 3, note that following encapsulation, the chip paddle 110, the internal leads 130, and the tie bars 150 remain externally exposed on the underside of the semiconductor package 200. The semiconductor package 200 is subsequently placed in electrical communication with the host device by fusing or soldering the exposed bottom surfaces or lands of the internal leads 130 to a motherboard (not shown).

Referring still to FIG. 3, the internal leads 130 on the underside of the semiconductor package 200 are regularly spaced at a distance G1 from each other. The internal leads 130 are all of substantially the same length L and are arranged at regular distances G1 to prevent the internal leads 130 which are closest to the corners from forming a short circuit upon soldering. Typically, the internal leads will have a fixed length L of about 0.4 mm to 0.6 mm. Unfortunately, as the other internal leads 130 which are not located near the corners are formed at the same length, the resulting semiconductor package 200 will typically exhibit very poor solder joint strength at the interface with the motherboard. Solder joint strength tends to vary proportionally with the amount of surface area placed in direct contact with the motherboard. Consequently, a lead having a larger surface area should exhibit greater solder joint strength than a lead with a smaller surface area.

BRIEF SUMMARY OF THE INVENTION

The present invention overcomes the shortcomings of the existing designs and satisfies a significant need for a leadframe and semiconductor package with improved solder joint strength at the interface between the semiconductor package and the motherboard to which it is mounted. More particularly, the leadframe and semiconductor package of the present invention address the need for improved solder joint strength by disposing internal leads of different lengths about the perimeter of the chip paddle.

In one embodiment of the present invention, the internal leads which are located centrally along the sides of the chip paddle are the longest in length whereas the shortest internal leads are located closer to the corners of the chip paddle. In another embodiment of the present invention, the internal leads located centrally along the sides of the chip paddle are formed at the shortest length whereas the longest internal leads are located closest to the corners of the chip paddle. In yet a further embodiment of the present invention, there is provided a semiconductor package comprising a semiconductor chip, a chip paddle, conductive wires and internal leads encapsulated within an encapsulation material with the chip paddle and internal leads externally exposed on an undersurface, produced from a leadframe with internal leads of different lengths located about the perimeter of the chip paddle.

In a semiconductor package using a leadframe constructed in accordance with the present invention, the solder joint strength between the semiconductor package and the motherboard can be improved by increasing the length or surface area of the internal leads which are brought into direct contact with the motherboard during soldering. Thus, in one embodiment, the leads are longer along the sides of the chip paddle to provide added solder joint strength to the entire chip package while reducing the likelihood of shorting across the leads near the corners. However, in an alternative embodiment that is well suited to larger package designs, the leads are longer near the corners of the chip paddle to ensure greater solder joint strength in an area of known stress concentration.

BRIEF DESCRIPTION OF THE DRAWINGS

A more complete understanding of the leadframe and semiconductor package of the present invention may be obtained by reference to the following detailed description, with like reference numerals denoting like elements, when taking in conjunction with the accompanying drawings wherein.

The various embodiments of the present invention will now be described more fully hereinafter with reference to the accompanying drawings.

DETAILED DESCRIPTION OF THE INVENTION

Figure 4:
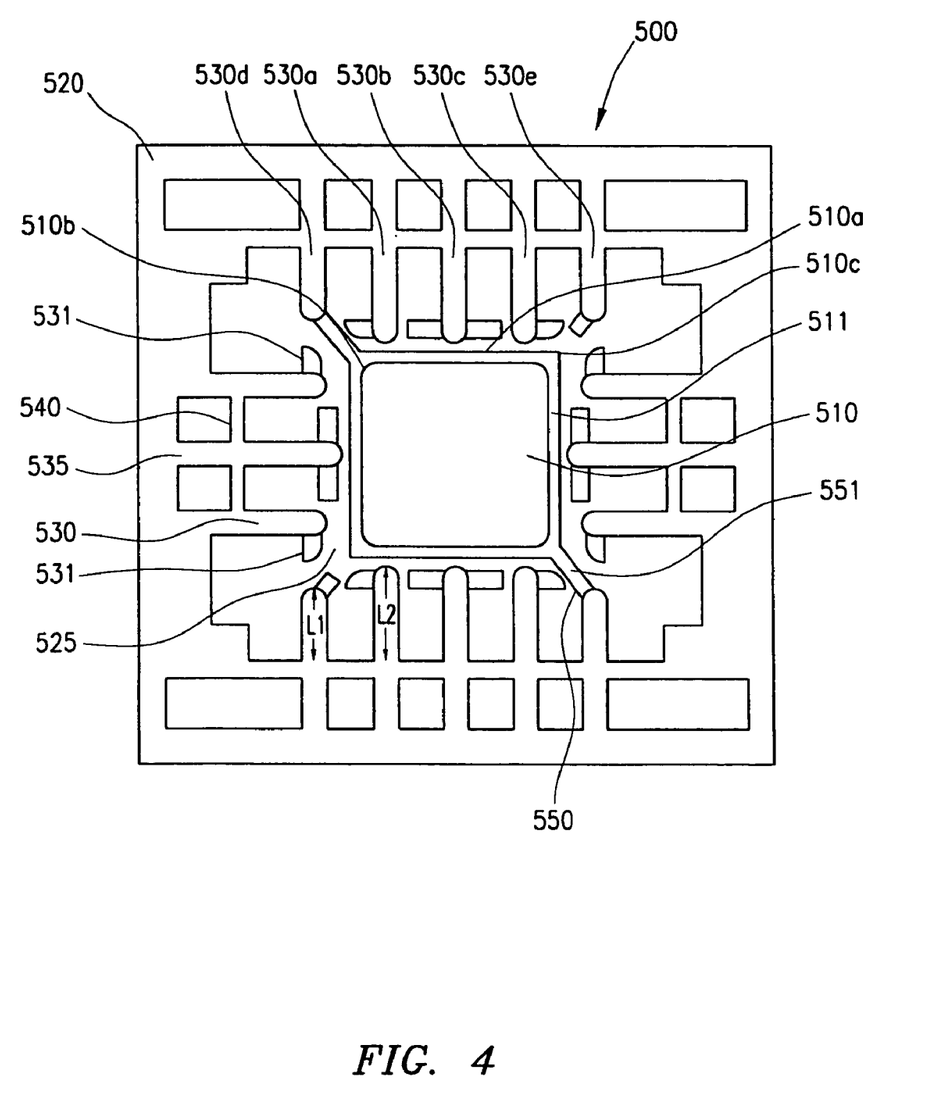
FIG. 4 is a top plan view of a leadframe structure according to one embodiment of the present invention having internal leads of at least two different lengths.

Referring now to FIG. 4, a top plan view of a leadframe 500 in accordance with one embodiment of the present invention and having internal leads of at least two different lengths is shown. The leadframe 500 has a plate-type frame body 520 with an opening 525 at its center and a chip paddle 510 located within the opening 525 on which a semiconductor chip (not shown) is subsequently mounted. About the perimeter of the chip paddle 510 and extending inwardly from the frame body 520 toward the opening 525, a plurality of internal leads 530 are located radially and spaced at regular intervals. The chip paddle 510 is connected to the frame body 520 by tie bars 550 which extend inwardly from the ends of two internal leads 530, as shown here, or from the frame body itself 520. The internal leads 530 extend outward into external leads 535 which are in turn made integral to the frame body 520. Dam bars 540 are provided to separate the internal leads 530 from the external leads 535 during the encapsulation process and to prevent encapsulation material (not shown) from covering the external leads 535. It is particularly notable that in the leadframe 500 according to one embodiment of the present invention, the internal leads 530 are of at least two different lengths L1 and L2.

Referring still to FIG. 4, the reference numerals 511, 531 and 551 denote half-etched portions of chip paddle 510, the internal leads 530 and the tie bars 550, respectively. These half-etched portions will generally be about half as thick as the remainder of the part. During the subsequent encapsulation process for forming a semiconductor package, encapsulation material flows under these portions of the part to ensure a better seal for the internal components.

Also, it is to be understood that the entire leadframe 500 including the frame body 520, chip paddle 510, internal leads 530, external leads 535, dam bars 540, and other structures may be formed of a single piece of material. Typically, this material will be a good electrical conductor such as aluminum, copper, or other metals and alloys. The leadframe may also be formed of one material and plated (wholly or partially) with another. Materials used to plate the leadframe include, but are not limited to, tin lead, tin, gold, silver, nickel, palladium, tin bismuth, or other similar materials know in the art. The leadframe 500 may be produced by either stamping or etching processes as known in the art.

Referring still to FIG. 4, it is shown that the internal leads 530a through 530e are not uniform in length. In contrast to conventional prior art leadframe designs, the leadframe 500 formed in accordance with the present invention features internal leads 530 having at least two different lengths. As shown here, the three internal leads 530a, 530b, and 530c, which are located near the center 510a of one side of the chip paddle 510, are longer than the internal leads 530d and 530e which are closest to the corners 510b and 510c of the chip paddle 510. This is also true of the internal leads 530 which are located about the other three sides of the chip paddle 510.

Alternatively, although not shown in FIG. 4, the internal leads 530a, 530b and 530c which are located nearest the center 510a of one side of the chip paddle 510 may be made shorter than those 530d and 530e which are closest to the corner areas 510b and 510c of the chip paddle 510. In packages having large sized leadframes, the weakest solder joint strength usually occurs in the corner regions of the package body, and short circuiting between the internal leads is less likely than in small sized leadframes.

While the internal leads 530 shown and described in these two embodiments are of two distinct lengths L1 and L2, it is to be understood that the internal leads 530 may be of several different lengths or widths, and are limited by the space provided between the chip paddle 510 and the frame body 520, and the need for sufficient lateral spacing between internal leads 530 to avoid short circuiting. The leadframe 500 according to the present invention addresses solder joint strength problems by placing more surface area of the internal leads 530 in direct contact with the motherboard (not shown) on which the semiconductor package is soldered. Longer or wider internal leads 530 will have greater surface area and accordingly have higher solder joint strength. However, as it is difficult to adjust the lateral spacing between internal leads 530 without short circuiting, producing a leadframe with different lengths of internal leads 530 appears to be the most direct solution to the solder joint strength problems of prior art leadframes.

Figure 5:
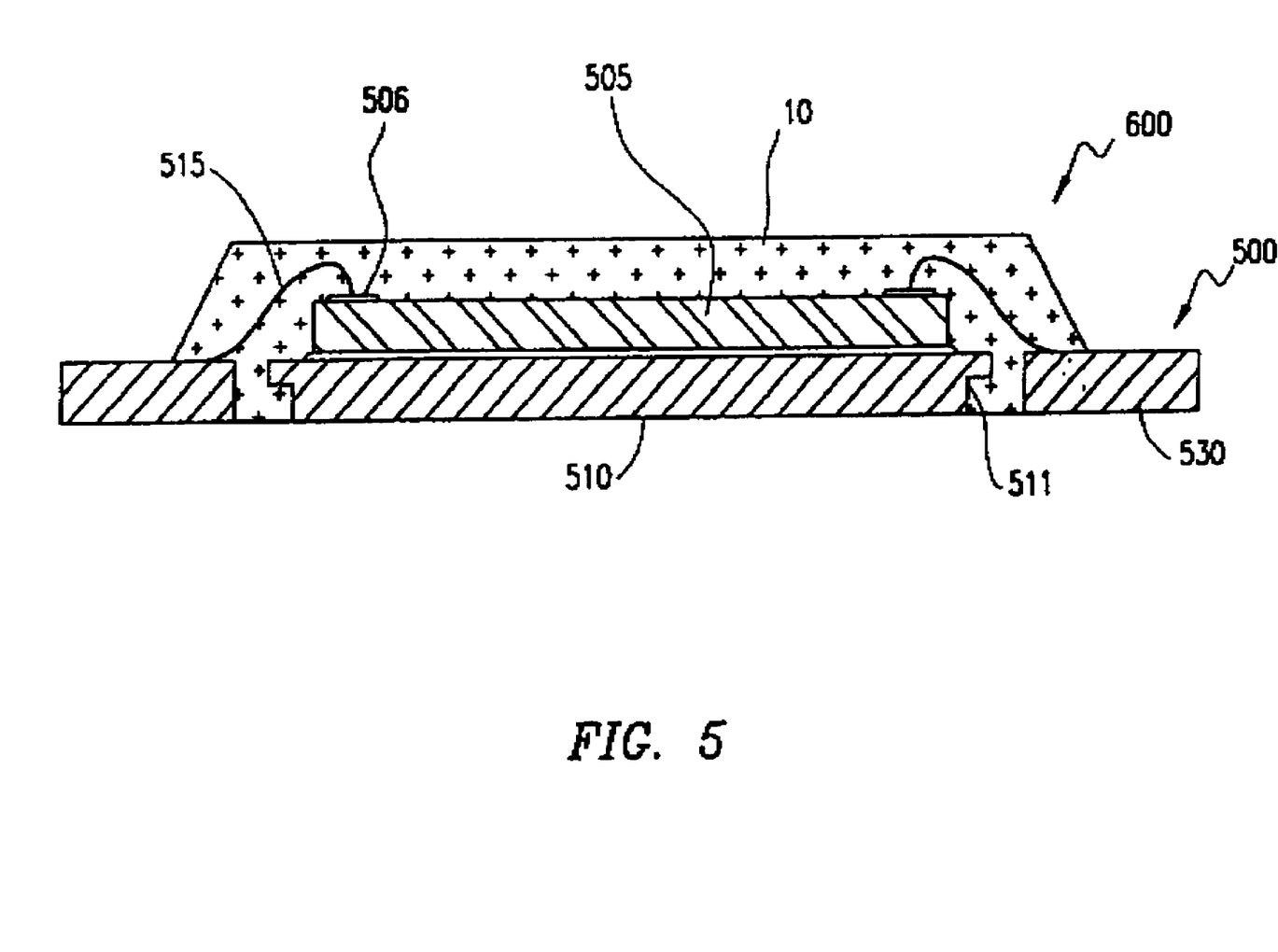
FIG. 5 is a side view of a semiconductor package having a semiconductor chip attached to the leadframe of FIG. 4 in accordance with one embodiment of the present invention.

Referring now to FIG. 5, a semiconductor package 600 is depicted using a leadframe 500 in accordance with one embodiment of the present invention. As shown, the semiconductor package 600 includes a semiconductor chip 505 having a plurality of bond pads 506 on its upper surface along its perimeter, and a chip paddle 510 which is bonded to the bottom surface of the semiconductor chip 505 via an adhesive. The chip paddle 510 also features a half-etched portion 511 along its perimeter. A plurality of internal leads 530, each of which has a half-etched portion (not shown) are radially located about the perimeter of the chip paddle 510. The top of each one of the plurality of internal leads 530 may be plated with silver plate or gold plate for better electrical conductivity. The bond pads 506 of the semiconductor chip 505 are electrically connected to the internal leads 530 via conductive wires 515. As shown here, the semiconductor chip 505, the chip paddle 510, the internal leads 530, and the conductive wires 515, are all sealed within an encapsulation material 10 to create a semiconductor package 600. Encapsulation material 10 can be thermoplastics or thermoset resins, with thermoset resins including silicones, phenolics, and epoxies. Referring back to FIG. 4, the external portions of the leadframe 500, namely the dam bars 540 and the external leads 535, which are not encapsulated are then trimmed off. The tie bars (not shown) may also be cut or singulated following encapsulation to completely separate the chip paddle 510 from the frame body 520.

Figure 6:
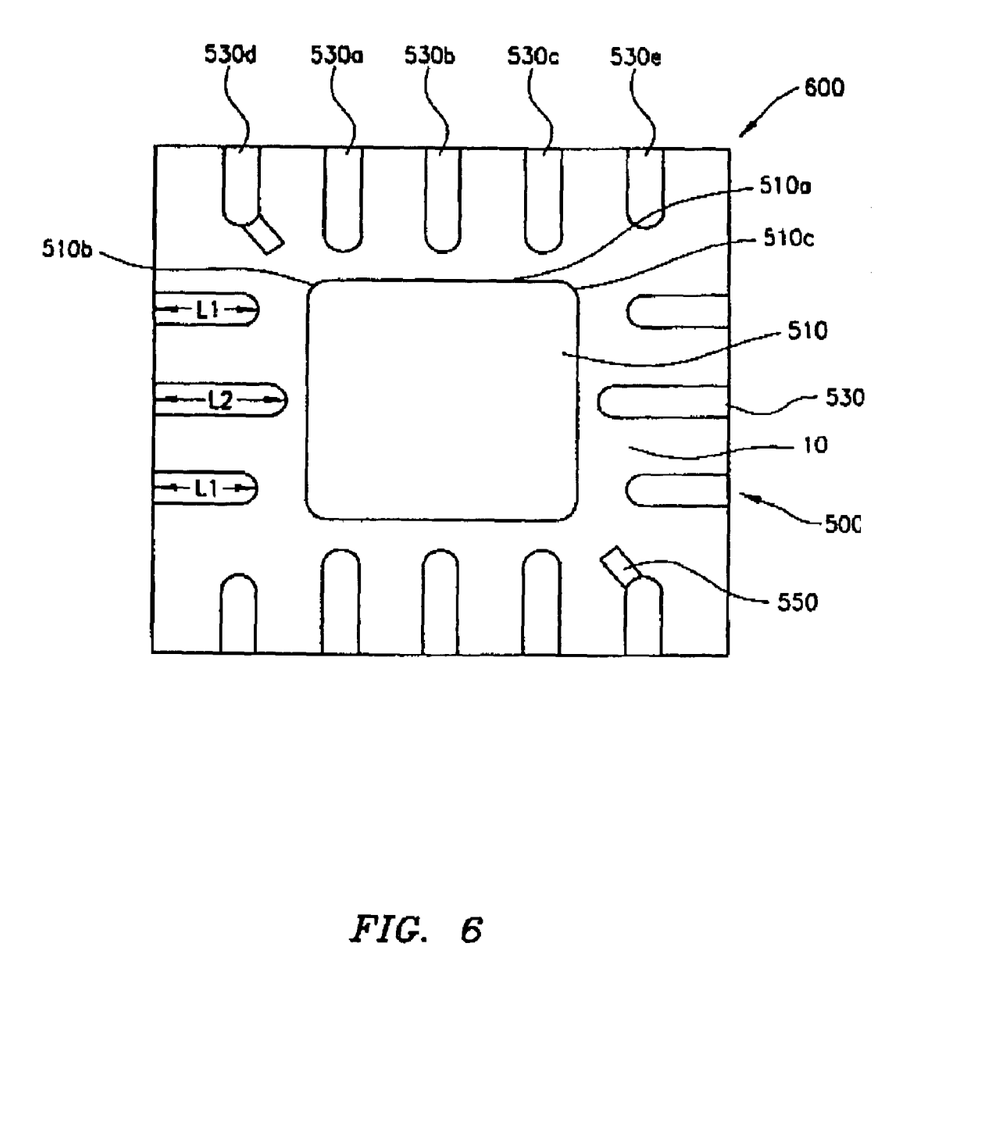
FIG. 6 is a bottom view of the semiconductor package of FIG. 5 having exposed external surfaces or lands suitable for solder mounting to a motherboard.

Referring now to FIG. 6, note that following encapsulation, the chip paddle 510, the internal leads 530, and the tie bars 550 remain externally exposed on the underside of the semiconductor package 600. To minimize corrosion, the externally exposed portions of the chip paddle 510, internal leads 530, and the tie bars 550 may be plated with tin lead, tin, gold, nickel palladium, tin bismuth, or other corrosion-minimizing materials known in the art. The semiconductor package 600 is subsequently placed in electrical communication with the host device by fusing or soldering the exposed bottom surfaces or lands of the internal leads 530 to a motherboard (not shown).

Referring still to FIG. 6, a bottom view illustrates the underside of the semiconductor package 600 featuring internal leads 530a–530e which are of two different lengths L1 and L2. As shown here, the internal leads proximate to any one side of the chip paddle, for example 530a–530e, may be divided into at least two subgroups referred to as outer leads 530d and 530e which are closest to the corners and inner leads 530a, 530b and 530c which are between the outer leads 530d and 530e and centrally located along the side 510a of the chip paddle 510. In this embodiment, the outer leads have a first length L1 and are shorter than the inner leads which have a length L2. By way of example only, L1 may be as short as 0.25 mm and L2 may be as long as 0.90 mm. This is true of the internal leads 530 proximate the other three sides of the chip paddle 510 as well.

Figure 7:
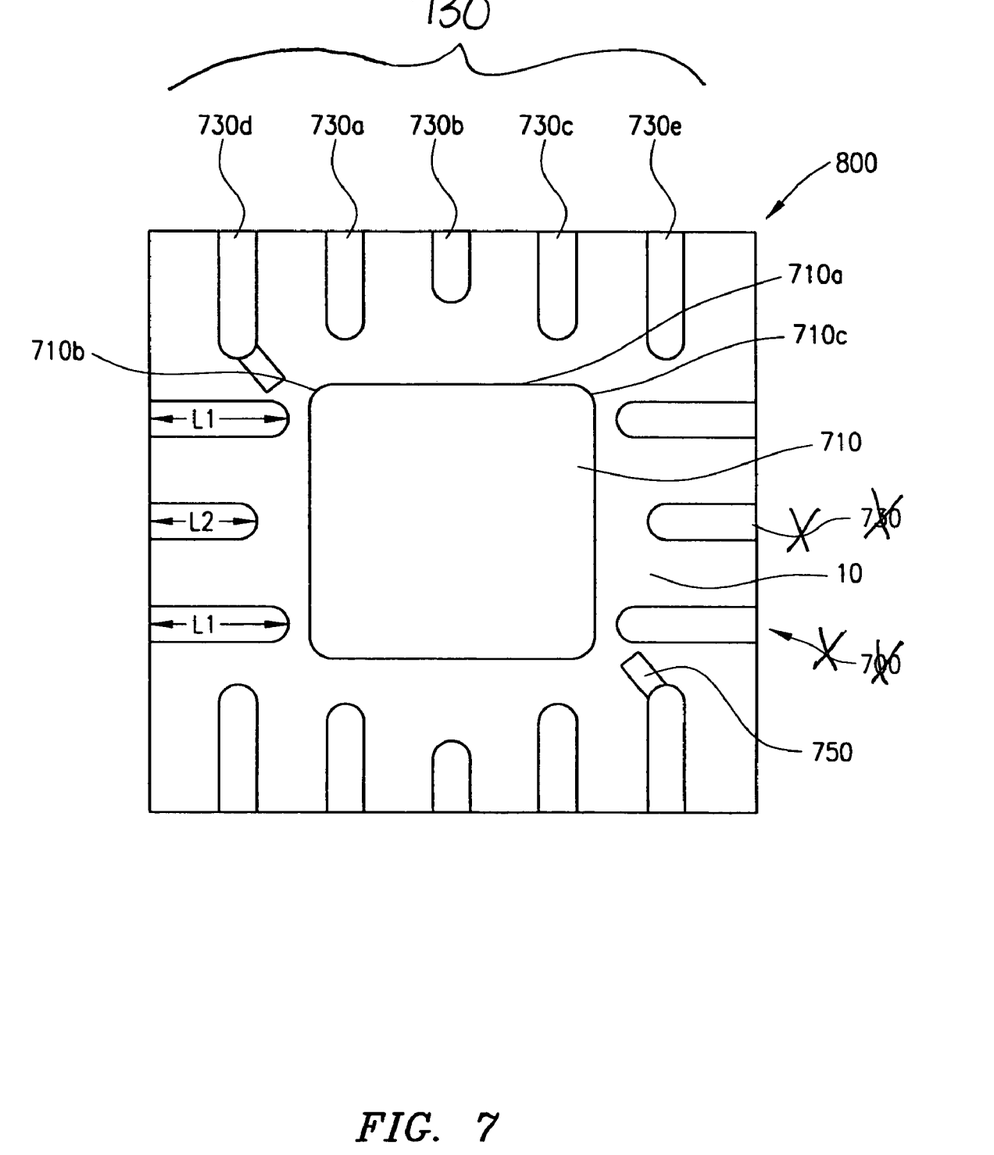
FIG. 7 is a bottom view of a semiconductor package using an alternative leadframe design in accordance with another embodiment of the present invention having exposed exterior surfaces or lands for solder mounting to a motherboard.

Referring now to FIG. 7, an alternative leadframe included in the semiconductor package 800 featuring internal leads 730 which are of at least two different lengths L1 and L2 is shown. The internal leads 730 proximate to any one side of the chip paddle 710, for example, may again be divided into at least two subgroups referred to as outer leads 730d and 730e which are closest to the corners 710b and 710c and inner leads 730a, 730b and 730c which are between the outer leads 730d and 730e (and tie bar portion 750) and centrally located along the side 710a of the chip paddle 710. In this alternative embodiment, the outer leads have a first length L1 and are longer than the inner leads which have a length L2 or less (e.g. 730b). By way of example only, L1 may be as long as 0.90 mm and L2 may be as short as 0.25 mm. This is true of the internal leads 730 proximate the other three sides of the chip paddle 710 as well. As noted earlier, the embodiment set forth in FIG. 7 is best suited to large size applications as there is a reduced tendency for short circuiting in the corners in comparison with small size applications. Note also that packages of 10×10 mm size could be considered relatively large, but that leadframes and packages could also be produced in accordance with the present invention in other industry standard sizes (e.g. 20×20, 24×24, 28×28, 32×32 and 40×40 mm).

The following applications are all being filed on the same date as the present application and all are incorporated by reference as if wholly rewritten entirely herein, including any additional matter incorporated by reference therein:

| Application Number | Title of Application | First Named Inventor |
| --- | --- | --- |
| 09/687,787 | Thin and Heat Radiant Semiconductor Package and Method for Manufacturing | Jae Hun Ku |
| 09/687,331 | Leadframe for Semiconductor Package and Mold for Molding the Same | Young Suk Chung |
| 09/687,532 | Method for Making a Semiconductor Package Having Improved Defect Testing and Increased Production Yield | Tae Heon Lee |
| 09/687,876 | Near Chip Size Semiconductor Package | Sean Timothy Crowley |
| 09/687,536 | End Grid Array Semiconductor Package | Jae Hun Ku |
| 09/687,585 | Semiconductor Package Having Reduced Thickness | Tae Heon Lee |
| 09/687,541 | Semiconductor Package Leadframe Assembly and Method of Manufacture | Young Suk Chung |

-continued

| Application Number | Title of Application | First Named Inventor |
|---|---|---|
| 09/687,049 | Method for Making Semiconductor Packages | Young Suk Chung |

It is thus believed that the operation and construction of the present invention will be apparent from the foregoing description of the preferred embodiments. While the leadframe and semiconductor package shown are described as being preferred, it will be obvious to a person of ordinary skill in the art that various changes and modifications may be made therein without departing from the spirit and the scope of the invention, as defined in the following claims. Therefore, the spirit and scope of the appended claims should not be limited to the description of the preferred embodiments contained herein.

This invention may, however, be embodied in many different forms and should not be construed as being limited to the embodiments set forth herein. Rather, the embodiments are provided so that this disclosure is thorough and complete, and fully conveys the scope of the invention to those skilled in the art.

What is claimed is:

1. A semiconductor package, comprising:
   a leadframe having:
      a chip paddle defining opposed top and bottom surfaces and a plurality of sides and corners; and
      at least two sets of leads extending along respective ones of the sides of the chip paddle in spaced relation thereto, each set of leads including at least two outer leads and at least one inner lead disposed between the outer leads, the inner and outer leads of each set each defining opposed top and bottom surfaces, with at least portions of the bottom surfaces of the outer leads of each set each being of a first length and at least a portion of the bottom surface of the inner lead of each set being of a second length which is unequal to the first length;
   a semiconductor chip mounted to the top surface of the chip paddle and electrically connected to at least one of the inner and outer leads; and
   an encapsulation material covering the leadframe and the semiconductor chip such that the portions of the bottom surfaces of the inner and outer leads of each set which are of the second length and the first length, respectively, are completely exposed in the encapsulation material and are arranged to intersect a single straight line extending between the outer leads.

2. The semiconductor package of claim 1 comprising multiple sets of leads which extend along respective ones of each of the sides of the chip paddle in spaced relation thereto.

3. The semiconductor package of claim 1 wherein the first length of the exposed portion of the bottom surface of each of the outer leads exceeds the second length of the exposed portion of the bottom surface of the inner lead.

4. The semiconductor package of claim 1 wherein the first length of the exposed portion of the bottom surface of each of the outer leads is less than the second length of the exposed portion of the bottom surface of the inner lead.

5. The semiconductor package of claim 1 wherein at least a portion of the bottom surface of the chip paddle is exposed in the encapsulation material.

6. The semiconductor package of claim 5 wherein:
   the encapsulation material defines a generally planar bottom surface;
   the exposed portion of the bottom surface of the chip paddle is generally planar and substantially flush with the bottom surface of the encapsulation material; and
   the exposed portions of the bottom surfaces of the inner and outer leads are each generally planar and substantially flush with the bottom surface of the encapsulation material.

7. The semiconductor package of claim 1 wherein the leadframe further comprises at least one tie bar attached to and extending from at least one of the corners of the chip paddle, the tie bar defining opposed top and bottom surfaces.

8. The semiconductor package of claim 7 wherein at least a portion of the bottom surface of the at least one tie bar is exposed in the encapsulation material.

9. The semiconductor package of claim 1, wherein:
   the encapsulation material defines a bottom surface which includes a peripheral edge; and
   the exposed portions of the bottom surfaces of the outer and inner leads of each set extend to the peripheral edge of the bottom surface.

10. A semiconductor package comprising:
    a semiconductor chip defining multiple sides;
    at least two sets of leads extending along respective ones of the sides of the semiconductor chip in spaced relation thereto, each set of leads including at least two outer leads and at least one inner lead disposed between the outer leads, the inner and outer leads of each set each defining opposed top and bottom surfaces, with at least portions of the bottom surfaces of the outer leads of each set each being of a first length and at least a portion of the bottom surface of the inner lead of each set being of a second length which is unequal to the first length, the semiconductor chip being electrically connected to at least one of the inner and outer leads; and
    an encapsulation material defining a bottom surface which includes a peripheral edge, the encapsulation material covering the inner lead, the outer leads and the semiconductor chip such that the portions of the bottom surfaces of the inner and outer leads of each set which are of the second length and the first length, respectively, are completely exposed in the encapsulation material and extend to the peripheral edge of the bottom surface.

11. The semiconductor package of claim 10 comprising multiple sets of leads which extend along respective ones of each of the sides of the semiconductor chip.

12. The semiconductor package of claim 10 wherein the first length of the exposed portion of the bottom surface of each of the outer leads exceeds the second length of the exposed portion of the bottom surface of the inner lead.

13. The semiconductor package of claim 10 wherein the first length of the exposed portion of the bottom surface of each of the outer leads is less than the second length of the exposed portion of the bottom surface of the inner lead.

14. The semiconductor package of claim 10 wherein:
    the encapsulation material defines a generally planar bottom surface; and
    the exposed portions of the bottom surfaces of the inner and outer leads are each generally planar and substantially flush with the bottom surface of the encapsulation material.

15. In a semiconductor package comprising a plurality of leads which each have a bottom surface including at least a portion which is completely exposed in an encapsulation material, and a semiconductor chip which defines multiple sides, is covered by the encapsulation material and electrically connected to at least one of the leads, the improvement comprising:

providing at least two sets of the leads which are extended along respective ones of the sides of the semiconductor chip and each include at least two outer leads and at least one inner lead disposed between the outer leads, with the portion of the bottom surface of each of the outer leads of each set which is completely exposed in the encapsulation material being of a first length, the portion of the bottom surface of the inner lead of each set which is completely exposed in the encapsulation material being of a second length which is unequal to the first length, and the exposed portions of the bottom surfaces of the inner and outer leads of each set being arranged to intersect a single straight line extending between the outer leads.

16. The semiconductor package of claim 15 wherein multiple sets of the extended along respective ones of each of the sides of the semiconductor chip.

17. The semiconductor package of claim 15 wherein the first length of the exposed portion of the bottom surface of each of the outer leads exceeds the second length of the exposed portion of the bottom surface of the inner lead.

18. The semiconductor package of claim 15 wherein the first length of the exposed portion of the bottom surface of each of the outer leads is less than the second length of the exposed portion of the bottom surface of the inner lead.

19. The semiconductor package of claim 15, wherein:

the encapsulation material defines a bottom surface which includes a peripheral edge; and the exposed portions of the bottom surfaces of outer and inner leads of each set extend to the peripheral edge of the bottom surface.

* * * * *